(12) United States Patent
Yang et al.

(10) Patent No.: US 8,894,889 B1
(45) Date of Patent: Nov. 25, 2014

(54) COMPOUND SEMICONDUCTOR PRECURSOR INK COMPOSITION, METHOD FOR FORMING A CHALCOGENIDE SEMICONDUCTOR FILM, AND METHOD FOR FORMING A PHOTOVOLTAIC DEVICE

(71) Applicants: Feng-Yu Yang, Miaoli County (TW); Ching Ting, Miaoli County (TW); Yueh-Chun Liao, Miaoli County (TW)

(72) Inventors: Feng-Yu Yang, Miaoli County (TW); Ching Ting, Miaoli County (TW); Yueh-Chun Liao, Miaoli County (TW)

(73) Assignee: Neo Solar Power Corp., Hsinchu Science Park, Hsinchu (TW)

( * ) Notice: Subject to any disclaimer, the term of this patent is extended or adjusted under 35 U.S.C. 154(b) by 49 days.

(21) Appl. No.: 13/890,264

(22) Filed: May 9, 2013

(51) Int. Cl.
*H01B 1/02* (2006.01)
*C09D 11/52* (2014.01)
*H01L 21/02* (2006.01)
*H01L 31/18* (2006.01)

(52) U.S. Cl.
CPC .......... *C09D 11/52* (2013.01); *H01L 21/02568* (2013.01); *H01L 21/02628* (2013.01); *H01L 31/18* (2013.01)

USPC ................ 252/519.1; 252/519.14; 252/519.4; 252/519.5; 427/126.1

(58) Field of Classification Search
CPC ............ H01B 1/02; H01B 1/22; B82Y 30/00; B82Y 40/00
USPC ................... 252/519.1, 519.14, 519.4, 519.5; 427/126.1
See application file for complete search history.

(56) References Cited

U.S. PATENT DOCUMENTS

2012/0280185 A1 11/2012 Liao
2012/0282730 A1 11/2012 Liao

*Primary Examiner* — Mark Kopec
*Assistant Examiner* — Haidung Nguyen
(74) *Attorney, Agent, or Firm* — Winston Hsu; Scott Margo

(57) ABSTRACT

A compound semiconductor precursor ink composition includes an ink composition for forming a chalcogenide semiconductor film and a peroxide compound mixed with the ink composition. A method for forming a chalcogenide semiconductor film and a method for forming a photovoltaic device each include using the compound semiconductor precursor ink composition containing peroxide compound to form a chalcogenide semiconductor film.

13 Claims, 4 Drawing Sheets

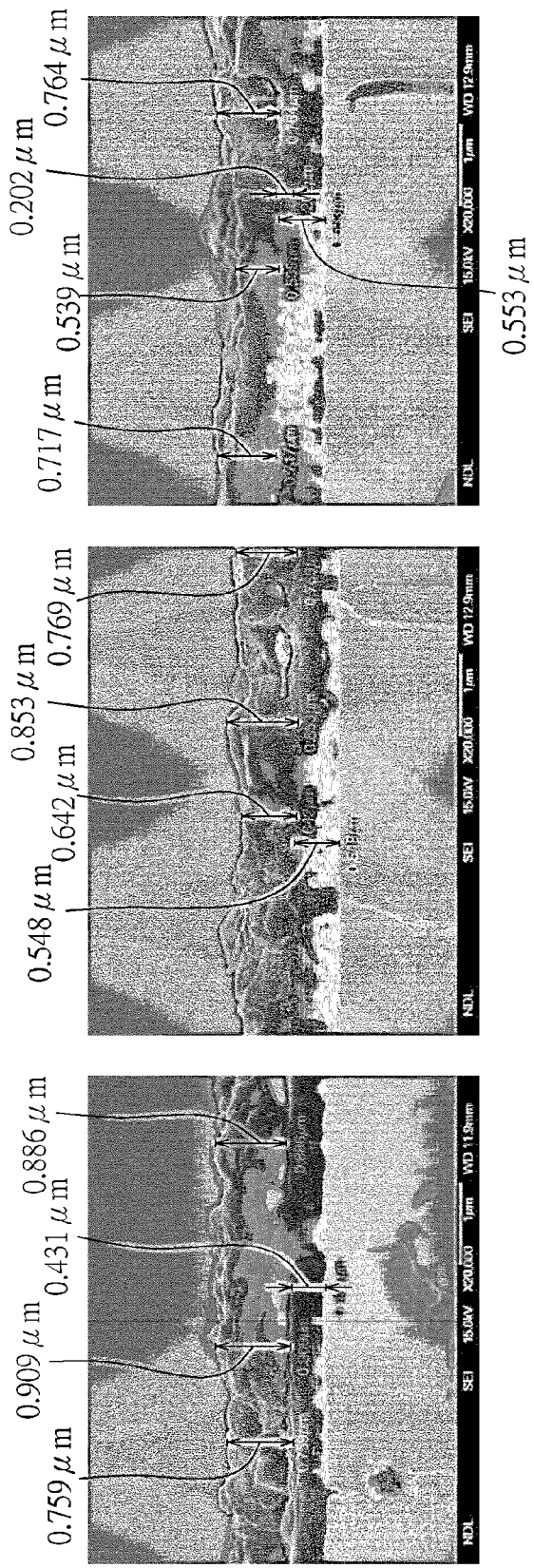

COMPOUND SEMICONDUCTOR PRECURSOR INK COMPOSITION, METHOD FOR FORMING A CHALCOGENIDE SEMICONDUCTOR FILM, AND METHOD FOR FORMING A PHOTOVOLTAIC DEVICE

BACKGROUND OF THE INVENTION

1. Field of the Invention

The present invention relates to a semiconductor material, and particularly to a semiconductor material for solar cells.

2. Description of the Prior Art

Photovoltaic devices can be generally classified into crystalline silicon solar cells and thin film solar cells. Crystalline silicon solar cells have mature manufacturing technology and high efficiency; however, the material and manufacturing cost high. Thin film solar cells are made by forming a light absorbing layer on a non-silicon substrate, such as glass substrate, and cost relatively low. Thin film solar cells can be further classified by material of the light absorbing layers, such as amorphous silicon, cadmium telluride (CdTe), copper indium gallium sulfide/selenide (CIS or CIGS), dye-sensitized film (DSSC) and other organic films.

The quaternary semiconductor $Cu_2ZnSn(S,Se)_4$ (also referred to as CZTS), having a multi-crystalline structure similar to CIGS, is new photovoltaic material which attracts interests recently due to its low cost, natural abundance and non-toxic elements. Conventional methods for forming CZTS films are carried out under vacuum environment. It is reported that Ito and Nakazawa prepared CZTS thin films on a stainless steel substrate by atom beam sputtering. Friedl Meier et al. prepared CZTS thin films by thermal evaporation. Katagiri et al. prepared CZTS thin films by RF sources co-sputtering followed by vapor phase sulfurization or by sulfurizing electron-beam-evaporated precursors. Vacuum processes are in general quite expensive and the cost of the CZTS solar cells is thus increased. U.S. Patent Application Publication No. 2012/0282730 and No. 2012/0280185, the entire contents of each of which are hereby incorporated as reference, each provide a method for forming a chalcogenide semiconductor film, which includes steps of coating a solution including an ink composition to form a layer on a substrate and heating the layer to form the chalcogenide semiconductor film. The methods of absorber film formation do not require vacuum equipments, and accordingly the manufacturing cost is reduced. Nevertheless, there is still a need for an improved ink composition for convenient and efficient film formation on substrates.

SUMMARY OF THE INVENTION

One objective of the present invention is to provide a compound semiconductor precursor ink composition for conveniently and efficiently forming a chalcogenide semiconductor film.

According to one embodiment of the present invention, a compound semiconductor precursor ink composition includes an ink composition for forming a chalcogenide semiconductor film and a peroxide compound mixed with the ink composition.

According to another embodiment of the present invention, a method for forming a chalcogenide semiconductor film includes steps as follows. A solution containing the compound semiconductor precursor ink composition as described above is coated on a substrate to form at least one layer on the substrate. The at least one layer is heated to form the chalcogenide semiconductor film.

According to further another embodiment of the present invention, a method for forming a photovoltaic device includes steps as follows. A bottom electrode layer is formed on a substrate. A solution containing the compound semiconductor precursor ink composition as described above is coated to form at least one layer on the bottom electrode layer. The at least one layer is heated to form the chalcogenide semiconductor film. An n-type semiconductor layer is formed on the chalcogenide semiconductor film. A top electrode layer is formed on the n-type semiconductor layer.

According to still another embodiment of the present invention, a method for forming a chalcogenide semiconductor film includes steps as follows. An ink composition for forming a chalcogenide semiconductor film is provided. The ink composition for forming a chalcogenide semiconductor film is mixed with a peroxide compound to form a mixture. The mixture is coated on a substrate to form at least one layer. The at least one layer is heated to form the chalcogenide semiconductor film.

In the embodiments of the present invention, the compound semiconductor precursor ink composition includes a peroxide compound mixed with an ink composition for forming a chalcogenide semiconductor film, so that, the layer of the compound semiconductor precursor ink composition on an substrate per coating is thicker than that of the ink composition without a peroxide compound mixed therewith, and the heated layer of the compound semiconductor precursor ink composition on the substrate per coating is also thicker than that of the ink composition without a peroxide compound mixed therewith. The peroxide compound is volatile per se or after decomposition in heating process such as drying or annealing process. Accordingly, for an expected final thickness or a reasonable thickness of the chalcogenide semiconductor film formed by several coatings of the ink composition on the substrate, the number of coating of the compound semiconductor precursor ink composition according the present invention can be reduced as compared with conventional ink compositions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2 and 3 show scanning electron microscopic pictures of chalcogenide semiconductor films according to some embodiments of the present invention;

FIG. 4 shows a scanning electron microscopic picture of a chalcogenide semiconductor film according to a comparative example;

DETAILED DESCRIPTION

Definitions

Figure 1:
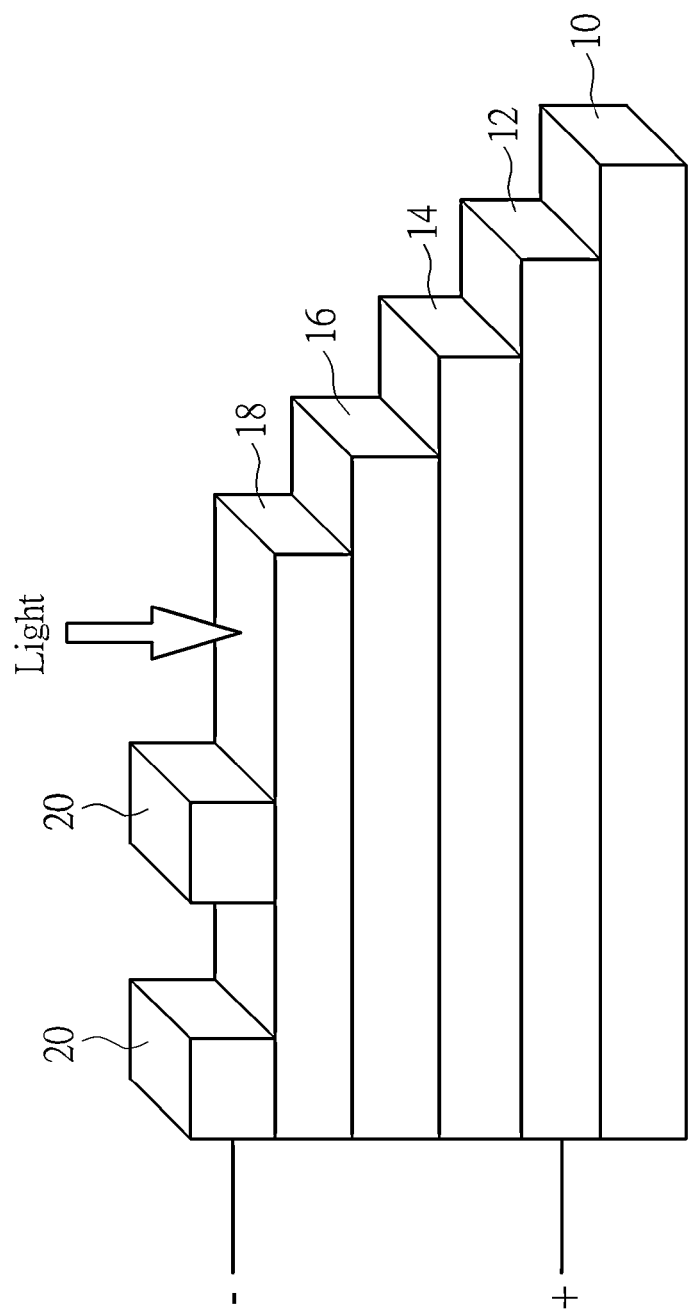
FIG. 1 shows a schematic perspective view for illustrating a chalcogenide semiconductor film used in a photovoltaic device and a method for forming a photovoltaic device.

The following definitions are provided to facilitate understanding of certain terms used herein and are not meant to limit the scope of the present disclosure.

"Chalcogen" refers to group VIA elements of periodic table. Preferably, the term "chalcogen" refers to sulfur and selenium.

"Chalcogenide compound" refers to a chemical compound containing at least one group VIA elements of periodic table.

"Chalcogenide semiconductor film", in a broad sense, refers to binary, ternary and quaternary chalcogenide compound semiconductor materials. Example of the binary chalcogenide compound semiconductor materials includes IV-VI compound semiconductor materials. The ternary chalcogenide compound semiconductor materials include compound semiconductor materials. The quaternary chalcogenide compound semiconductor materials include I-II-IV-VI compound semiconductor materials.

"IV-VI compound semiconductor material" refers to compound semiconductor materials composed of group IVA element and group VIA element of periodic table, such as tin sulfide (SnS).

"I-III-VI compound semiconductor materials" refers to compound semiconductor materials composed of group IB element, group IIIA element and group VIA element of periodic table, such as CIS or CIGS.

"I-II-IV-VI compound semiconductor materials" refers to compound semiconductors composed of group IB element, group IIB element, group IVA element and group VIA element of periodic table, such as CZTS.

"CIS", in a broad sense, refers to a type of compound semiconductor materials. Preferably, the term "CIS" refers a copper indium selenide/sulfide compound of the formula: e.g. $CuIn(Se_xS_{1-x})_2$, wherein $0 \leq x \leq 1$. For example, the term "CIS" may include copper indium selenide/sulfide compounds with fractional stoichiometries, e.g., $CuIn(Se_{0.65}S_{0.35})_2$.

"CZTS", in a broad sense, refers to I-II-IV-VI compound semiconductor materials. Preferably, the term "CZTS" refers a copper zinc tin sulfide/selenide compound of the formula: e.g. $[Cu_a(Zn_{1-b}Sn_b)(Se_{1-c}S_c)_2]_2$, wherein $0<a<1$, $0<b<1$, $0 \leq c \leq 1$. The term "CZTS" further includes copper zinc tin sulfide/selenide compounds with fractional stoichiometries, e.g., $Cu_{1.94}Zn_{0.63}Sn_{1.3}S_4$. Further, I-II-IV-VI compound semiconductor materials include I-II-IV-IV-VI compound semiconductor materials, such as copper zinc tin germanium sulfide, and I-II-IV-IV-VI-VI compound semiconductor materials such as copper zinc tin germanium sulfide selenide.

"CICS", in a broad sense, refers to I-III-VI compound semiconductor materials. In one embodiment of the present application, "CICS" refers a copper indium gallium selenium/sulfide compound of the formula, e.g., $CuIn_xGa_{1-x}Se_2$, where $0 \leq x \leq 1$. The term "CICS" further includes copper indium gallium selenium/sulfide compound with fractional stoichiometries, e.g., $Cu_{0.9}In_{0.7}Ga_{0.3}Se_2$.

"Ink" refers to a solution containing precursors which can form a semiconductor film. The term "ink" also refers to "precursor solution" or "precursor ink".

"Metal chalcogenide" refers to a compound composed of metal and group VIA element of periodic table. Preferably, the term "metal chalcogenide" refers to binary, ternary and quaternary metal chalcogenide compounds.

"Ligand" refers to a molecule or an ion interacting with a central metal ion. A ligand can form a bonding, including chemical bonding and physical interaction, to the central metal ion to form a metal complex ion.

"Chalcogen-containing ligand" refers to a ligand which includes at least one group VIA element of periodic table.

"Chalcogen-containing metal complex ion" refers to a metal complex ion which includes one or more chalcogen-containing ligands.

"Chalcogen source" refers to compounds which can form metal chalcogenide with metals.

"Nanoparticle" refers to a particle with a dimension ranged from about 2 nm to about 2000 nm.

Compound Semiconductor Precursor Ink Composition

The compound semiconductor precursor ink composition according to the present invention includes an ink composition for forming a chalcogenide semiconductor film and a peroxide compound mixed with the ink composition. The chalcogenide semiconductor film may include CZTS, CIGS, CIS, CdTe, or a combination thereof.

Types of the peroxide compounds suitable in the present invention may be classified into, for example, inorganic peroxide, such as hydrogen peroxide and peroxide ion ($[O-O]^{2-}$), and organic peroxide, such as aliphatic peroxide ($R^1-O-O-R^2$), organic hydroperoxide ($R^3-O-O-H$), and peracid ($R^4COOOH$). $R^1$, $R^2$, $R^3$ and $R^4$ mark hydrocarbon moieties. For good water solubility of these organic peroxides, $R^1$, $R^2$, $R^3$ and $R^4$ may be each preferably a $C_1$-$C_4$ hydrocarbyl group, i.e. a hydrocarbyl group containing one to four carbon atoms. In other embodiments in which an organic solvent is employed, $R^1$, $R^2$, $R^3$ and $R^4$ may be each preferably a $C_1$-$C_{16}$ hydrocarbyl group in consideration of solubility.

The simplest stable peroxide is hydrogen peroxide. Other inorganic peroxide may be for example sodium peroxide, $Na_2O_2$, which contains the divalent ion $^-O-O^-$.

The peroxide compound may be added alone or in a form of adduct, for example, adduct of hydrogen peroxide and urea or adduct of sodium carbonate and hydrogen peroxide. The adduct of hydrogen peroxide and urea, which may be also referred to as urea peroxide, carbamide peroxide ($CH_6N_2O_3$), or urea hydrogen peroxide, may be represented by the following structural formula (I).

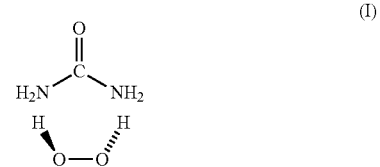

(I)

The adduct of sodium carbonate and hydrogen peroxide may have a formula $2Na_2CO_3 \cdot 3H_2O_2$ and be represented by the following structural formula (II).

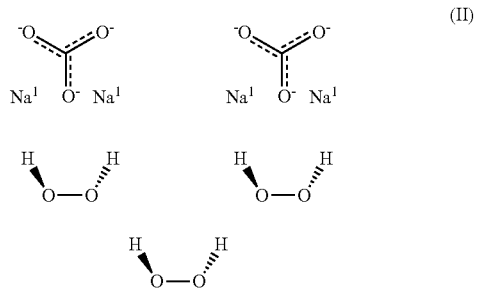

(II)

The peroxide compound is mixed with the ink composition for forming a chalcogenide semiconductor film. The peroxide compound may be used in an amount so that the ratio of the weight of the peroxide compound to the volume of the ink composition may be for example in the range of from, preferably 2.5% (w/v) to 25% (w/v), more preferably 2.5% (w/v) to 12.5% (w/v), and most preferably 2.5% (w/v) to 5.0% (w/v). When peroxide compound is added in an amount more than 25% (w/v), the resulted mixture properties may be have affected, such as high viscosity or poor dispersion of the nanoparticles. The peroxide compound per se or in a form of adduct may be dissolved in a solvent in advance or not dissolved in a solvent, and mixed with the ink composition and stirred for a period of time, for example, preferably 0.5 hr to 24 hr. The solvent may be the same as the solvent of the ink composition, but not limited thereto.

The ink composition for forming a chalcogenide semiconductor film may include a solvent and metal ions and/or metal complex ions and/or metal chalcogenide nanoparticles containing metals required for forming the chalcogenide semiconductor film. The amount of each component may depend on the type of semiconductor film, the application and the like. Some ink compositions are described as follows for illustration purpose, but not for limitation to the scope of the present invention.

For example, an ink composition for forming a chalcogenide semiconductor film may include at least one of metal ions and metal complex ions, a plurality of metal chalcogenide nanoparticles, and a solvent. Metals of all of the metal chalcogenide nanoparticles, the metal ions and the metal complex ions may include at least one selected from group IB of periodic table, at least one selected from group IIB of periodic table, and at least one selected from group IVA of periodic table. For example, the metals of all of the metal chalcogenide nanoparticles, the metal ions and the metal complexions may include copper, zinc, and tin; and the chalcogenide of the metal chalcogenide nanoparticles may further include sulfide and/or selenide, so as to form the CZTS semiconductor film. The solvent may include, for example, water, alcohol, or ether, so that the peroxide compound can be dissolved in the solvent. The metal chalcogenide nanoparticles, the metal ions and the metal complex ions may be dissolved or dispersed in the solvent.

For example, according to an embodiment, an ink composition for forming a chalcogenide semiconductor film may include at least one of metal ions and metal complex ions, a plurality of metal chalcogenide nanoparticles, and a solvent. Metals of all of the metal chalcogenide nanoparticles, the metal ions and the metal complexions may include at least one selected from group IB of periodic table and at least one selected from group IIIA of periodic table. For example, the metal chalcogenide nanoparticles, the metal ions and the metal complex ions may include copper, indium and gallium; and the chalcogenide of the metal chalcogenide nanoparticles may further include sulfide and/or selenide, so as to form the CIGS semiconductor film. The solvent may include, for example, water, alcohol, or ether, so that the peroxide compound can be dissolved in the solvent. The metal chalcogenide nanoparticles, the metal ions and the metal complex ions may be dissolved or dispersed in the solvent.

For example, according to an embodiment, an ink composition for forming a chalcogenide semiconductor film may include at least one of metal ions and metal complex ions, a plurality of metal telluride nanoparticles, and a solvent. Metals of all of the metal telluride nanoparticles, the metal ions and the metal complex ions may include cadmium. The solvent may include, for example, water, alcohol, or ether, so that the peroxide compound can be dissolved in the solvent. The metal telluride nanoparticles, the metal ions and the metal complex ions may be dissolved or dispersed in the solvent.

The metal chalcogenide nanoparticles may include only one kind of metal chalcogenide nanoparticles or more than one kind of metal chalcogenide nanoparticles. For example, the metal chalcogenide nanoparticles may include a plurality of tin sulfide nanoparticles. In another example, the metal chalcogenide nanoparticles may include tin sulfide nanoparticles and copper sulfide nanoparticles. The metal chalcogenide nanoparticles may include multi-nary metal chalcogenide nanoparticles, such as copper tin sulfide nanoparticles. Besides, the metal chalcogenide nanoparticles may include nanoparticles each of which constitutes by at least two metal chalcogenides. At least two metal chalcogenides may be selected from, for example, the group consisting of tin chalcogenide, zinc chalcogenide, copper chalcogenide, indium chalcogenide and gallium chalcogenide.

The metal chalcogenide nanoparticles may include, for example, tin sulfide (Sn—S), copper sulfide (Cu—S), zinc sulfide (Zn—S), indium sulfide (InS), gallium sulfide (Ga—S), tin selenide (Sn—Se), copper selenide (Cu—Se), zinc selenide (Zn—Se), indium selenide (InSe), gallium selenide (Ga—Se), copper tin sulfide (Cu—Sn—S), copper zinc sulfide (Cu—Zn—S), zinc tin sulfide (Zn—Sn—S), copper indium sulfide (Cu—In—S), copper gallium sulfide (Cu—Ga—S), copper indium gallium sulfide (Cu—In—Ga—S), copper tin selenide (Cu—Sn—Se), copper zinc selenide (Cu—Zn—Se), zinc tin selenide (Zn—Sn—Se), copper indium selenium (Cu—In—Se), copper gallium selenide (Cu—Ga—Se) and copper indium gallium selenide (Cu—In—Ga—Se). The use of hyphen ("-", e.g., in Cu—S, or Cu—Sn—S) indicates that the formula encompasses all possible combinations of those elements, such as "Cu—S" encompasses CuS and $Cu_2S$. The stoichiometry of metals and chalcogen can vary from a strictly molar ratio, such as 1:1 or 2:1. Further, fractional stoichiometries, such as $Cu_{1.8}S$ are also included. The metal chalcogenide nanoparticles may be formed from one or more metal salts and one or more chalcogen sources.

The metal ions may include more than one kind of metal ions, and the metal complex ions may include one or more kinds of metal complex ions. The metals of the metal ions and the metal complexions can be selected from group IB, group IIB, group IIIA and group IVA of periodic table depending on the type of chalcogenide semiconductor film desired. The metal ions may include, for example, copper ions, tin ions, zinc ions, germanium ions, aluminum ions, indium ions or gallium ions. The metal complex ions may include chalcogen-containing metal complex ions, which can be prepared by mixing metal ions and chalcogen-containing ligands. The chalcogen-containing ligands may include, for example, thioacetamide, thiourea, or ammonium sulfide. The chalcogen-containing metal complex ions may include metal-thiourea ions, metal-thioacetamide ions, or metal-ammonium sulfide ions, such as copper-thiourea ions, tin-thiourea ions, germanium-thiourea ions, copper-thioacetamide ions, tin-thioacetamide ions, germanium-thiourea ions, indium-thiourea ions, gallium-thiourea ions, indium-thioacetamide ions, and gallium-thioacetamide ions.

The metal chalcogenide nanoparticles are present in the ink composition for forming the chalcogenide semiconductor film in an amount, so that the ratio of the weight of the metal chalcogenide nanoparticles to the total volume of the ink composition is in a range of from about 1% (w/v) to about 80% (w/v). The metal ions and/or the metal complex ions are present in the ink composition for forming the chalcogenide semiconductor film in an amount of from about 0.5% (w/v) to about 80% (w/v).

The solvent of the ink composition for forming a chalcogenide semiconductor film may be a polar solvent including, for example, water, an alcohol, dimethyl sulfoxide (DMSO), an amine or a combination thereof. Examples of alcohol include methanol, ethanol or isopropyl alcohol.

The ink composition for forming the chalcogenide semiconductor film may be prepared as described in detail in U.S. Patent Application Publication No. 2012/0282730 and No. 2012/0280185.

According to another embodiment of the present invention, a method for forming a chalcogenide semiconductor film includes steps as follows. A solution containing the compound semiconductor precursor ink composition as described above is coated onto a substrate to form at least one layer on the substrate. In detail, the solution may include the compound semiconductor precursor ink composition, or the solution may include an additional suitable solvent and the compound semiconductor precursor ink composition which is further dissolved in the suitable solvent.

The coating method may include, but not limited to, for example, drop casting, spin coating, dip coating, doctor blading, curtain coating, slide coating, spraying, slit casting, meniscus coating, screen printing, ink jet printing, pad printing, flexographic printing or gravure printing. The substrate can be rigid, such as, glass substrate, or flexible, such as metal foil or plastic substrate. In some embodiments, the substrate is deposited with an electrical conductive material, such as molybdenum (Mo), tungsten (W), platinum (Pt), titanium (Ti), or gold (Au) layer before coating with the solution containing the compound semiconductor precursor ink composition.

Thereafter, the at least one layer coated on the substrate is heated to form the chalcogenide semiconductor film. The heating may include two stages of drying and annealing. During the drying process, the solvent is removed by evaporation. The drying method may include, for example, elevating the temperature by, for example, placing the substrate in a furnace or an oven, on a hot plate, or under irradiation of IR, or by other heating approach. For example, while the compound semiconductor precursor ink composition of a CZTS film is used, the drying process can be carried out at a temperature from about 25° C. to 600° C., preferably from 350° C. to 480° C., and most preferably about 425° C. to 540° C. The coating and drying steps can be repeated once or more, for example, from about 2 times to about 10 times.

Thereafter, the precursor film is heated for annealing to form the chalcogenide semiconductor film. For example, the annealing temperature of the precursor film of CZTS can be from about 300° C. to 700° C., preferably from 480° C. to 650° C., and most preferably about 540° C. to 650° C. In this embodiment, the annealing process can be carried out at a temperature of about 540° C. for 10 minutes. In some embodiments, the annealing process can be carried out under an atmosphere containing sulfur and/or selenium sources.

The peroxide compound contained in the compound semiconductor precursor ink composition can vaporize or be decomposed to vaporize, so that it does not remain within the obtained chalcogenide semiconductor film in a significant amount.

The chalcogenide semiconductor film per coating obtained from the compound semiconductor precursor ink composition according to the present invention is thicker than that per coating obtained from the ink composition without peroxide compound. Accordingly, the number of coating for precursor film to get reasonable or desired thickness can be reduced. The chalcogenide semiconductor film preferably has, but is not limited to have, a thickness of from 0.5 μm to 10 μm for use in a photovoltaic device.

Without being bound to any particular theory, it is hypothesized that there exists interaction between the peroxide compound and other component/components, such as metal ions and metal complex ions, contained in the compound semiconductor precursor ink composition according to the present invention, so that the viscosity of the compound semiconductor precursor ink composition applied on a surface may be enhanced, and thus a relatively thick film is available.

According to further another embodiment of the present invention, a method for forming a photovoltaic device includes steps as follows. Referring to FIG. 1, a bottom electrode layer 12 is formed on a substrate 10. A solution containing the compound semiconductor precursor ink composition as described above is coated to form at least one layer on the bottom electrode layer 12. The coating method may be as described above. The at least one layer is heated to form the chalcogenide semiconductor film 14. The heating method may be as described above. An n-type semiconductor layer 16 is formed on the chalcogenide semiconductor film. A top electrode layer 18 is formed on the n-type semiconductor layer 16.

The substrate 10 may include a material selected from the group consisting of glass, metal foil and plastic, but be not limited thereto. The bottom electrode layer 12 may include a suitable conductive material, such as a material selected from the group consisting of molybdenum (Mo), tungsten (W), aluminum (Al), titanium (Ti) and Indium Tin Oxide (ITO). The bottom electrode layer 12 may be an electrode or a contact which is electrically connected to an electrode, such as a positive electrode. In this embodiment, the bottom electrode layer 12 may be a Mo layer formed on the substrate 10 by sputtering.

The n-type semiconductor layer 16, which may serve for a buffer layer, is formed on the chalcogenide semiconductor film 14. For example, the n-type semiconductor layer 16 may include a material selected from the group consisting of cadmium sulfide (CdS), Zn(O,OH,S), indium Sulfide ($In_2S_3$), zinc sulfide (ZnS), and zinc magnesium oxide ($Zn_xMg_{1-x}O$, x is a number between 0 and 1). For example, in an embodiment, a CdS layer is formed as an n-type semiconductor layer on the chalcogenide semiconductor film 14 which is a CZTS film. The CdS layer can be formed by chemical bath deposition method. In this embodiment, the thickness of the CdS layer can be, for example, about 20 nm to about 150 nm.

The top electrode layer 18 may include an electrode, a conductive layer, or a contact. When the top electrode layer 18 is a contact layer, it is electrically connected to an electrode. When the top electrode layer 18 is a conductive layer, as shown in FIG. 1, a set of contacts 20 may be formed further on the top electrode layer 18, and the set of contacts 20 are further electrically connected to an electrode, such as a negative electrode. Top electrode layer 18 may include a transparent conductive layer. For example, the top electrode layer 18 may include a material selected from the group consisting of zinc oxide (ZnO), indium tin oxide (ITO), boron-doped zinc oxide (B—ZnO), aluminum-doped zinc oxide (Al—ZnO), gallium-doped zinc oxide (Ga—ZnO), and antimony tin oxide (ATO). In an embodiment, a zinc oxide (ZnO) film of a thickness of about 100 nm and an indium tin oxide film (ITO) of a thickness of about 130 nm are formed as the top electrode layer 18 on the semiconductor layer 16. The method for forming the ZnO film and the ITO film can be, for example, sputtering.

The metal contacts 20 can be formed of nickel (Ni)/aluminum (Al). The method of forming Ni/Al metal contacts 20 can be, for example, electron-beam evaporation. An anti-reflective film (not shown) may be further formed to cover the top electrode layer 18.

Some examples are described hereinafter, but may not be construed into the limitations to the scope of the present invention.

Examples

Preparation of Bottom Electrode

A Mo layer having a thickness of about 200 nm to about 1000 nm (300-600 nm preferred) was formed as a bottom electrode on a glass substrate. The Mo layer can be formed, for example, by a sputtering process.

Comparative Example

Comparative Composition (as Baseline) Preparation and the CZTS Film Formation

A CZTS precursor ink serving as Comparative Composition was prepared by the following procedure:
(a) 1.29 millimoles (mmol) of $SnCl_2$ was dissolved in 1.5 milliliters (ml) of water and stirred for 5 minutes to form a solution (A1), 0.45 grams (g) of thiourea was dissolved in 3 ml of water to form a solution (B1) and then solution (A1) and solution (B1) were mixed and stirred to formed a solution (C1).
(b) 1.65 mmol of $Cu(NO_3)_2$ was dissolved in 1 ml of water to form a solution (D1), 1.38 mmol of $Zn(NO_3)_2$ was dissolved in 1 ml of water to form a solution (E1), and then solution (C1), solution (D1) and solution (E1) were mixed and stirred to form a solution (F1).
(c) 1.4-1.8 ml of $(NH_4)_2S$ aqueous solution was added into the solution (F1) and stirred overnight or under sonication for 30 minutes to form the CZTS precursor ink, denoted as Comparative Composition, also serving as a baseline.

This CZTS precursor ink, i.e. Comparative Composition, was coated onto the Mo layer by spin coating method. The coated CZTS precursor ink was then dried at 210° C. and 425° C. sequentially. The coating and drying process were repeated for 5 and 8 times to obtain various precursor films. Then, the precursor films of 5- and 8-layered coating were crystallized into a CZTS thin film under an annealing temperature of about 540-650° C., giving p-type chalcogenide semiconductor layers, respectively.

Example

Formation of the Compound Semiconductor Precursor Ink Composition Having Hydrogen Peroxide Additive and Formation of the CZTS Film Formation of compound semiconductor precursor ink composition:
Composition 1:
(a) 1.29 mmol of $SnCl_2$ was dissolved in 1.5 ml of water and stirred for 5 minutes to form a solution (A1), 0.45 g of thiourea was dissolved in 3 ml of water to form a solution (B1) and then solution (A1) and solution (B1) were mixed and stirred to form a solution (C1).
(b) 1.65 mmol of $Cu(NO_3)_2$ was dissolved in 1 ml of water to form a solution (D1), 1.38 mmol of $Zn(NO_3)_2$ was dissolved in 1 ml of water to form a solution (E1), and then solution (C1), solution (D1) and solution (E1) were mixed and stirred to form a solution (F1).
(c) 1.4-1.8 ml of $(NH_4)_2S$ aqueous solution was added into the solution (F1) and stirred overnight or under sonication for 30 minutes to form the CZTS precursor ink (baseline).
(d) 4 ml of baseline ink and 0.8 ml $H_2O_2$ (30% in $H_2O$) were mixed and stirred overnight or under sonication for 30 minutes, giving Composition 1.
Composition 2:
(a) 1.29 mmol of $SnCl_2$ was dissolved in 1.5 ml of water and stirred for 5 minutes to form a solution (A1), 0.45 g of thiourea was dissolved in 3 ml of water to form a solution (B1) and then solution (A1) and solution (B1) were mixed and stirred to form a solution (C1).
(b) 1.65 mmol of $Cu(NO_3)_2$ was dissolved in 1 ml of water to form a solution (D1), 1.38 mmol of $Zn(NO_3)_2$ was dissolved in 1 ml of water to form a solution (E1), and then solution (C1), solution (D1) and solution (E1) were mixed and stirred to form a solution (F1).
(c) 1.4-1.8 ml of $(NH_4)_2S$ aqueous solution was added into the solution (F1) and stirred overnight or under sonication for 30 minutes to form the CZTS precursor ink (baseline).
(d) 4 ml of baseline ink and 1 ml $H_2O_2$ (30% in $H_2O$) were mixed and stirred overnight or under sonication for 30 minutes, giving Composition 2.

Method for Forming the p-Type Chalcogenide Semiconductor Layer:

Composition 1 and Composition 2 were coated onto the Mo layer by spin coating method, respectively. The coated Composition 1 and Composition 2 each were then dried at 210° C. and 425° C. sequentially. For Composition 1, the coating and drying process were repeated for 3, 5, and 8 times, respectively; and for Composition 2, the coating and drying process were repeated for 3 and 5 times, respectively, to obtain various precursor films. Then, the precursor films of 3-, 5- and 8-layered coating were crystallized into CZTS thin films under an annealing temperature of about 540-650° C., giving p-type chalcogenide semiconductor layers.

Formation of Photovoltaic Device Formation of Semiconductor Layer:

A CdS layer was formed on the CZTS thin film. The CdS layer was formed by a chemical bath deposition method (CBD). The CdS layer had a thickness of about 50 nanometers (nm) and served as an n-type inorganic semiconductor layer.

Formation of Top Electrode:

A ZnO layer and an ITO layer were formed on the CdS layer sequentially. The ZnO and ITO layers were formed by sputtering. The thickness of the ZnO layer was about 100 nm and the thickness of the ITO layer was about 150 nm.

Formation of Metal Contacts:

A silver layer was formed and patterned on the ITO layer to form metal contacts.

RESULTS

Figures 5, 6:
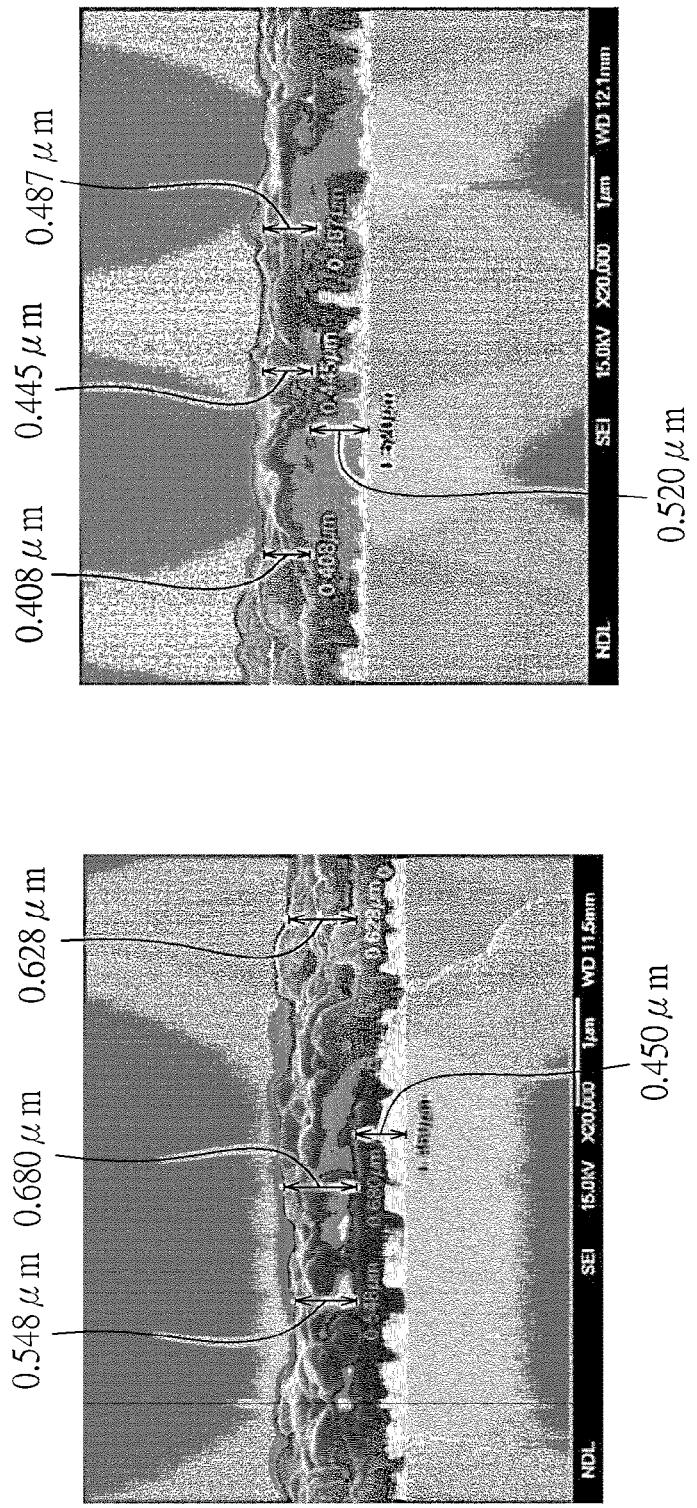
FIGS. 5 and 6 show scanning electron microscopic pictures of chalcogenide semiconductor films according to some embodiments of the present invention.

The thicknesses of the CZTS films from Comparative Composition, Composition 1 and Composition 2 had been determined by scanning electron microscopy (SEM), respectively. FIGS. 2-4 show scanning electron microscopic pictures of the CZTS films made from 5-layered coating of Composition 1, Composition 2, and Comparative Composition, respectively. FIGS. 5 and 6 show scanning electron microscopic pictures of the CZTS films made from 3-layered coating of Composition 1 and Composition 2, respectively. As shown in Table 1 and FIGS. 2-6, thicker films were obtained by baseline with $H_2O_2$.

TABLE 1

Thicknesses of the CZTS films

|  | Composition 1 | Composition 2 | Comparative Composition |
|---|---|---|---|
|  | Baseline (4 ml) + $H_2O_2$ (30%, 0.8 ml) (v/v = 5:1) | Baseline (4 ml) + $H_2O_2$ (30%, 1 ml) (v/v = 4:1) | Baseline |
| 5-layered Coating | 759-909 nm | 642-853 nm | 539-764 nm |
| 3-layered Coating | 548-680 nm | 408-487 nm | N/A |

The I-V performance of devices with CZTS film (5-layered coating) was determined and data are listed in Table 2. It shows that devices made from Composition 1 and Composition 2 (i.e. baseline with $H_2O_2$) performed with similar or better efficiency than device made from Comparative Composition, i.e. baseline.

TABLE 2

I-V performance of devices with CZTS film (5-layered coating)

|  |  | Composition 1 | Composition 2 | Comparative Composition |
|---|---|---|---|---|
|  |  | Baseline (4 ml) + $H_2O_2$ (30%, 0.8 ml) (v/v = 5:1) | Baseline (4 ml) + $H_2O_2$ (30%, 1 ml) (v/v = 4:1) | Baseline |
| 5-layered Coating |  | 759-909 nm | 642-853 nm | 539-764 nm |
| I-V performance | Jsc (mA/$cm^2$) | 26.91 | 27.01 | 30.76 |
|  | Voc (V) | 0.42 | 0.43 | 0.37 |
|  | Fill Factor (%) | 0.46 | 0.56 | 0.49 |
|  | Efficiency (%) | 5.23 | 6.54 | 5.48 |

Figure 8:
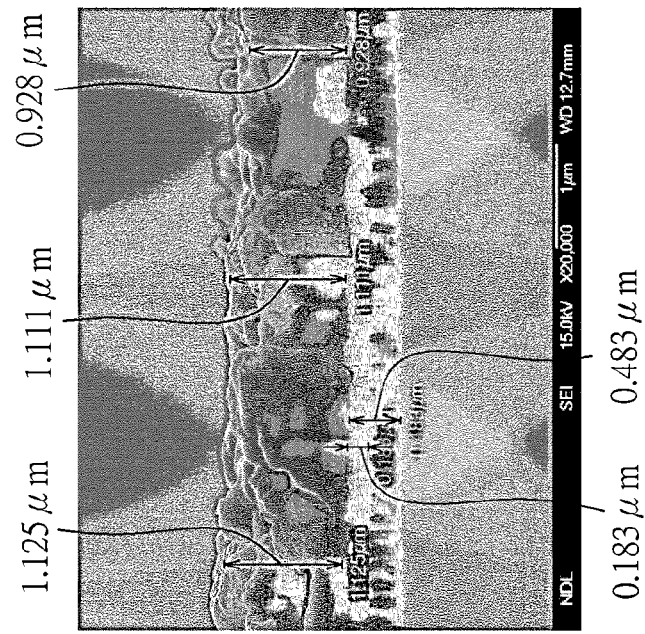
FIG. 8 shows a scanning electron microscopic picture of a chalcogenide semiconductor film according to an embodiment of the present invention.
Figure 7:
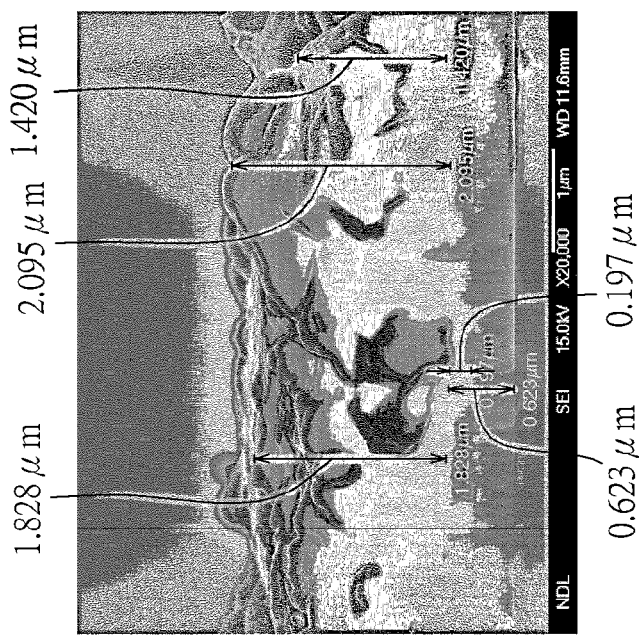
FIG. 7 shows a scanning electron microscopic picture of a chalcogenide semiconductor film according to a comparative example.

The film thicknesses and the I-V performance of devices with CZTS film (8-layered coating) from Composition 1 and Comparative Composition were determined and data are listed in Table 3. FIGS. 7 and 8 show scanning electron microscopic pictures of the CZTS films made through 8-layered coating of Composition 1 and Comparative Composition, respectively. Table 3 and FIGS. 7 and 8 show that CZTS film (8-layered coating) from baseline with $H_2O_2$ is thicker than that from baseline ink composition. Table 3 also shows that device made from baseline with $H_2O_2$ performed with similar or better I-V performance than device made from baseline ink composition only.

TABLE 3

Thicknesses and I-V performance of devices with CZTS film (8-layered coating)

|  |  | Composition 1 | Comparative Composition |
|---|---|---|---|
|  |  | Baseline (4 ml) + $H_2O_2$ (30%, 0.8 ml) (v/v = 5:1) | Baseline |
| 8-layered Coating |  | 1420-2095 nm | 928-1125 nm |
| I-V performance | Fill Factor (%) | 58.06 | 59.31 |
|  | Voc (V) | 0.49 | 0.50 |
|  | Imp (mA) | 8.02 | 7.72 |
|  | Cell eff. (%) | 8.03 | 7.52 |
|  | Jsc (mA/$cm^2$) | 27.97 | 25.52 |

TABLE 3-continued

Thicknesses and I-V performance of devices with CZTS film (8-layered coating)

|  | Composition 1 | Comparative Composition |
|---|---|---|
| Rshort (Rs) | 15.68 | 17.98 |
| Rshunt (Rsh) | 184.87 | 255.04 |

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A compound semiconductor precursor ink composition, comprising:
    an ink composition for forming a chalcogenide semiconductor film; and
    a peroxide compound mixed with the ink composition for forming a chalcogenide semiconductor film.

2. The compound semiconductor precursor ink composition according to claim 1, wherein the chalcogenide semiconductor film comprises at least one selected from the group consisting of CZTS, CIGS, CIS, and CdTe.

3. The compound semiconductor precursor ink composition according to claim 1, wherein the ink composition for forming a chalcogenide semiconductor film comprises:
    at least one of metal ions and metal complex ions;
    a plurality of metal chalcogenide nanoparticles; and
    a solvent, wherein metals of all of the metal chalcogenide nanoparticles, the metal ions and the metal complex ions comprise at least one selected from group IB of periodic table, at least one selected from group JIB of periodic table, and at least one selected from group IVA of periodic table.

4. The compound semiconductor precursor ink composition according to claim 3, wherein the metals of all of the metal chalcogenide nanoparticles, the metal ions and the metal complex ions comprise copper, zinc, and tin.

5. The compound semiconductor precursor ink composition according to claim 4, wherein chalcogenide of the metal chalcogenide nanoparticles comprises sulfide, selenide, or both of sulfide and selenide.

6. The compound semiconductor precursor ink composition according to claim 3, wherein the solvent comprises one selected from the group consisting of water, alcohols, and ethers.

7. The compound semiconductor precursor ink composition according to claim 1, wherein the ink composition for forming a chalcogenide semiconductor film comprises:
    at least one of metal ions and metal complex ions;
    a plurality of metal chalcogenide nanoparticles; and
    a solvent, wherein metals of all of the metal chalcogenide nanoparticles, the metal ions and the metal complex ions comprise at least one selected from group IB of periodic table and at least one selected from group IIIA of periodic table.

8. The compound semiconductor precursor ink composition according to claim 7, wherein the metals of all of the metal chalcogenide nanoparticles, the metal ions and the metal complex ions comprise copper and indium or comprise copper, indium and gallium.

9. The compound semiconductor precursor ink composition according to claim 8, wherein chalcogenide of the metal chalcogenide nanoparticles comprises sulfide, selenide, or both of sulfide and selenide.

10. The compound semiconductor precursor ink composition according to claim 7, wherein the solvent comprises one selected from the group consisting of water, alcohols, and ethers.

11. The compound semiconductor precursor ink composition according to claim 1, wherein the ink composition for forming a chalcogenide semiconductor film comprises:
    at least one selected from the group consisting of cadmium ions, cadmium complex ions, and cadmium telluride nanoparticles; and
    a solvent.

12. The compound semiconductor precursor ink composition according to claim 11, wherein the solvent comprises one selected from the group consisting of water, alcohols, and ethers.

13. The compound semiconductor precursor ink composition according to claim 1, wherein the peroxide compound comprises one selected from the group consisting of hydrogen peroxide, peroxide ion having a formula $[O-O]^{2-}$, an aliphatic peroxide having a formula $R^1-O-O-R^2$, an organic hydroperoxide having a formula $R^3-O-O-H$, and a peracid having a formula $R^4COOOH$, wherein $R^1$, $R^2$, $R^3$ and $R^4$ are each independently a hydrocarbyl group having 1 to 16 carbon atoms.

* * * * *